United States Patent
Riggsby et al.

(10) Patent No.: US 8,971,792 B2
(45) Date of Patent: Mar. 3, 2015

(54) SIGNAL AMPLIFIERS THAT SWITCH TO AN ATTENUATED OR ALTERNATE COMMUNICATIONS PATH IN RESPONSE TO A POWER INTERRUPTION

(71) Applicant: CommScope, Inc. of North Carolina, Hickory, NC (US)

(72) Inventors: Robert R. Riggsby, Hickory, NC (US); Shi Man Li, Hickory, NC (US); Ming Yao Lee, Taichung (TW)

(73) Assignee: CommScope, Inc. of North Carolina, Hickory, NC (US)

( * ) Notice: Subject to any disclaimer, the term of this patent is extended or adjusted under 35 U.S.C. 154(b) by 102 days.

(21) Appl. No.: 13/761,369

(22) Filed: Feb. 7, 2013

(65) Prior Publication Data
US 2013/0342272 A1 Dec. 26, 2013

Related U.S. Application Data

(63) Continuation-in-part of application No. 13/531,936, filed on Jun. 25, 2012.

(51) Int. Cl.
| | |
|---|---|
| H04H 20/71 | (2008.01) |
| H01Q 11/12 | (2006.01) |
| H04B 1/04 | (2006.01) |
| H04B 1/16 | (2006.01) |
| H03F 3/00 | (2006.01) |
| H03F 3/195 | (2006.01) |
| H03F 3/72 | (2006.01) |

(52) U.S. Cl.
CPC .................. *H03F 3/00* (2013.01); *H03F 3/195* (2013.01); *H03F 3/72* (2013.01)

USPC ..................... 455/3.05; 455/127.1; 455/343.1

(58) Field of Classification Search
USPC ............... 455/3.05, 15, 103, 127.1, 132, 133, 455/343.1; 725/64, 127, 149
See application file for complete search history.

(56) References Cited

U.S. PATENT DOCUMENTS

| | | | |
|---|---|---|---|
| 6,980,643 | B2 | 12/2005 | Chen et al. |
| 7,912,431 | B2 | 3/2011 | Phillips et al. |
| 7,974,586 | B2 | 7/2011 | Romerein et al. |
| 2005/0026571 | A1 | 2/2005 | Yang et al. |
| 2005/0068223 | A1 | 3/2005 | Vavik |
| 2006/0015921 | A1 | 1/2006 | Vaughan |
| 2006/0205442 | A1 | 9/2006 | Phillips |
| 2007/0165611 | A1 | 7/2007 | Yang et al. |
| 2008/0112392 | A1 | 5/2008 | Mansfield |
| 2010/0162340 | A1* | 6/2010 | Riggsby ................... 725/127 |
| 2011/0283331 | A1* | 11/2011 | Riggsby ................... 725/106 |
| 2013/0343245 | A1* | 12/2013 | Li et al. .................... 370/297 |

\* cited by examiner

*Primary Examiner* — Nguyen Vo
(74) *Attorney, Agent, or Firm* — Myers Bigel Sibley & Sajovec, P.A.

(57) ABSTRACT

RF signal amplifiers are provided that include an RF input port, a switching device having an input that is coupled to the RF input port, a first output and a second output, a first diplexer having an input that is coupled to both the first output of the switching device and the second output of the switching device, and a first RF output port that is coupled to an output of the first diplexer. These amplifiers further include an attenuator that is coupled between the second output of the switching device and the input of the first diplexer.

15 Claims, 12 Drawing Sheets

SIGNAL AMPLIFIERS THAT SWITCH TO AN ATTENUATED OR ALTERNATE COMMUNICATIONS PATH IN RESPONSE TO A POWER INTERRUPTION

CROSS-REFERENCE TO RELATED APPLICATION

The present application claims priority under 35 U.S.C. §120 as a continuation-in-part of U.S. patent application Ser. No. 13/531,936, filed Jun. 25, 2012, the entire content of which is incorporated herein by reference as if set forth in its entirety.

FIELD OF THE INVENTION

The present invention is directed to technology for providing non-interruptible communications.

BACKGROUND

In recent years, the rise of the Internet and other online communications methods have rapidly transformed the manner in which electronic communications take place. Today, rather than relying on prior-generation switched telephone communications arrangements, many service providers are turning to Internet Protocol (IP) based communications networks. Such networks can provide flexibility in facilitating the transmission of voice, data, video, and other information at great speeds.

In many cases, the above-referenced IP communications networks may comprise cable television networks that are used to transmit cable television signals and other information between a service provider and a plurality of subscribers, typically over coaxial and/or fiber optic cables. Typically, the service provider is a cable television company that may offer, among other things, cable television, broadband Internet and Voice-over-Internet Protocol ("VoIP") digital telephone service to subscribers within a particular geographic area. A subscriber may receive all of these services through a single radio frequency ("RF") connection between the service provider and the subscriber premise. The service provider may transmit both "downstream" signals (which are also sometimes referred to as "forward path" signals) from the headend facilities of the cable television network to the subscriber premises and "upstream" signals (which are also sometimes referred to as "reverse path" signals) from the individual subscriber premises back to the headend facilities. The downstream signals are currently transmitted in the 54-1002 MHz frequency band, and may include, for example, different tiers of cable television channels, movies on demand, digital telephone and/or Internet service (the signals received by the subscriber), and other broadcast or point-to-point offerings. The upstream signals are currently transmitted in the 5-42 MHz frequency band and may include, for example, signals associated with digital telephone and/or Internet service (the signals transmitted by the subscriber) and ordering commands (i.e., for movies-on-demand and other services).

In many cases, significant attenuation may occur as signals are passed through the cable television network, and hence the power level of the RF signal that is received at subscriber premises may be on the order of 0-5 dBmV/channel. Such received signal levels may be insufficient to support the various services at an acceptable quality of service level. Accordingly, RF signal amplifiers may be provided at or near individual subscriber premises that are used to amplify the downstream RF signals to a more useful level. These RF signals amplifier may also be configured to amplify the upstream RF signals that are transmitted from the subscriber premise to the headend facilities of the cable television network.

Unfortunately, RF signal amplifiers comprise active devices that require a power feed for proper operation. Accordingly, if power to an RF signal amplifier is interrupted, some or all of the communications between the service provider and the subscriber premise may be lost. Although such interruptions may be tolerated in relation to certain non-essential services, interruptions to other services may be unacceptable. For example, subscribers relying on IP-based emergency communications (i.e., 911 service) can be left without such services during power interruptions.

In order to remedy this problem, some subscribers may be inclined to acquire a dedicated switched telephone line to provide emergency services during power interruptions. Nevertheless, such an option can require the subscriber to incur additional costs, and fails to capitalize on the advantages offered by IP-based communication.

SUMMARY

Pursuant to embodiments of the present invention, bi-directional RF signal amplifiers are provided that include an RF input port, a switching device having an input that is coupled to the RF input port, a first output and a second output, a first diplexer having an input that is coupled to both the first output of the switching device and the second output of the switching device, and a first RF output port that is coupled to an output of the first diplexer. These amplifiers further include an attenuator that is coupled between the second output of the switching device and the input of the first diplexer.

In some embodiments, these amplifiers may further include a power input for receiving electrical power. In such embodiments, the switching device may be configured to pass signals between the input of the switching device and the first output of the switching device when electrical power is received at the power input and may be further configured to pass signals between the input of the switching device and the second output of the switching device when an electrical power feed to the power input is interrupted. The attenuator may, for example, include an attenuator input port, an attenuator output port, at least one resistor coupled in series on a signal path extending between the attenuator input port and the attenuator output port and at least one resistor shunted between the signal path and a reference voltage.

In some embodiments, the amplifier may also include a second RF output port and a directional coupler having an input that is coupled to the RF input port, a first output that is coupled to the input of the switching device and a second output that is coupled to the second RF output port via a non-interruptible communications path. The amplifier may also include a power amplifier having an input that is coupled to an output of the first diplexer and a second diplexer that is coupled between an output of the power amplifier and the first RF output port. In some embodiments, the amplifier may further include a second non-interruptible communications path that is configured to pass upstream signals from the first RF output port to the RF input port via the attenuator when the electrical power feed to the power input is interrupted.

Pursuant to further embodiments of the present invention, RF signal amplifiers are provided that include a power regulation circuit that is configured to generate a power supply voltage in response to power received from an external source, an RF input port, and first and second RF output ports. These amplifiers further include a first communications path that extends between the RF input port and the first RF output port. This first communications path may include a power amplifier that is configured to amplify downstream signals passing from the RF input port to the first RF output port. The amplifiers may also include a second, non-interruptible communications path that extends between the RF input port and the second RF output port. The second, non-interruptible communications path may be configured to support both downstream and upstream RF communications even in the absence of power from the external source. Finally, the amplifiers may include a switching device that is configured to selectively switch a circuit element in series onto the first communications path in response to a loss of power from the external source.

In some embodiments, the circuit element may be an attenuator, and the switching device may be a non-latching relay. Moreover, the RF signal amplifier may further include a first diplexer that is coupled between a first output of the switching device and the first RF output port, a second diplexer that is coupled between the first diplexer and the first RF output port, and a power amplifier that is coupled between the first and second diplexers. In some embodiments, a directional coupler may also be included in the amplifier that has an input that is coupled to the RF input port, a first output that is coupled to the first communications path and a second output that is coupled to the second, non-interruptible communications path.

Pursuant to still further embodiments of the present invention, bi-directional RF signal amplifiers are provided that include an RF input port, a first switching device having an input that is coupled to the RF input port, a second switching device having an input that is coupled to a non-interruptible RF output port, and a directional coupler having an input that is coupled to a first output of the first switching device, a first output that is coupled to an amplified communications path and a second output that is coupled to a first output of the second switching device.

In some embodiments, the second output of the first switching device may be coupled to a second output of the second switching device. In such embodiments, the RF signal amplifier may further include a second directional coupler having an input that is coupled to the second output of the first switching device, a first output that is coupled to the second output of the second switching device and a second output that is coupled to a second non-interruptible RF output port or an attenuator that is coupled between the second output of the first switching device and the second output of the second switching device. In some embodiments, an insertion loss on a communications path between the RF input port and the non-interruptible RF output port is less than 1.5 dB.

Pursuant to still further embodiments of the present invention, bi-directional RF signal amplifiers are provided that include an RF input port and first and second RF output ports. These amplifiers further include an amplified communications path that connects the RF input port to the first RF output port and a non-amplified communications path that connects the RF input port to the second RF output port. The amplifiers also include a first switching device that is part of both the amplified communications path and the non-amplified communication path and a second switching device that is part of the non-amplified communications path. The bi-directional RF signal amplifier is configured to simultaneously carry signals on both the amplified communications path and the non-amplified communications path when power is supplied to the RF signal amplifier.

In some embodiments, the second switching device is not part of the amplified communications path. In some embodiments, the amplifier may further include a directional coupler that is part of both the amplified and the non-amplified communications paths when power is supplied to the RF signal amplifier, but which is not part of the non-amplified communications path when power is not supplied to the RF amplifier.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", etc.).

In accordance with various embodiments set forth in the present disclosure, bi-directional RF signal amplifies are provided that each have at least one non-interruptible communications port for maintaining communications in the event of a power failure. In various embodiments, the RF signal amplifier may receive RF signals from a service provider or any other appropriate signal source through an RF input port.

For example, in residential applications, an RF signal amplifier in accordance with various embodiments of the present disclosure may receive a composite downstream RF signal of approximately 5 dBmV/channel in the range of approximately 54-1002 MHz comprising information for telephone, cable television (CATV), Internet, VoIP, and/or data communications from a service provider. The RF signal amplifier may increase this downstream signal to a more useful level of approximately 20 dBmV/channel and pass the amplified downstream signal to one or more devices in communication with the RF signal amplifier through various RF output ports. Such devices may include, but need not be limited to: televisions, modems, telephones, computers, and/or other communications devices known in the art. In the event of power failure, an unamplified signals may still be passed (in both directions) through a communications path between the service provider and at least one communications device.

Figure 1:
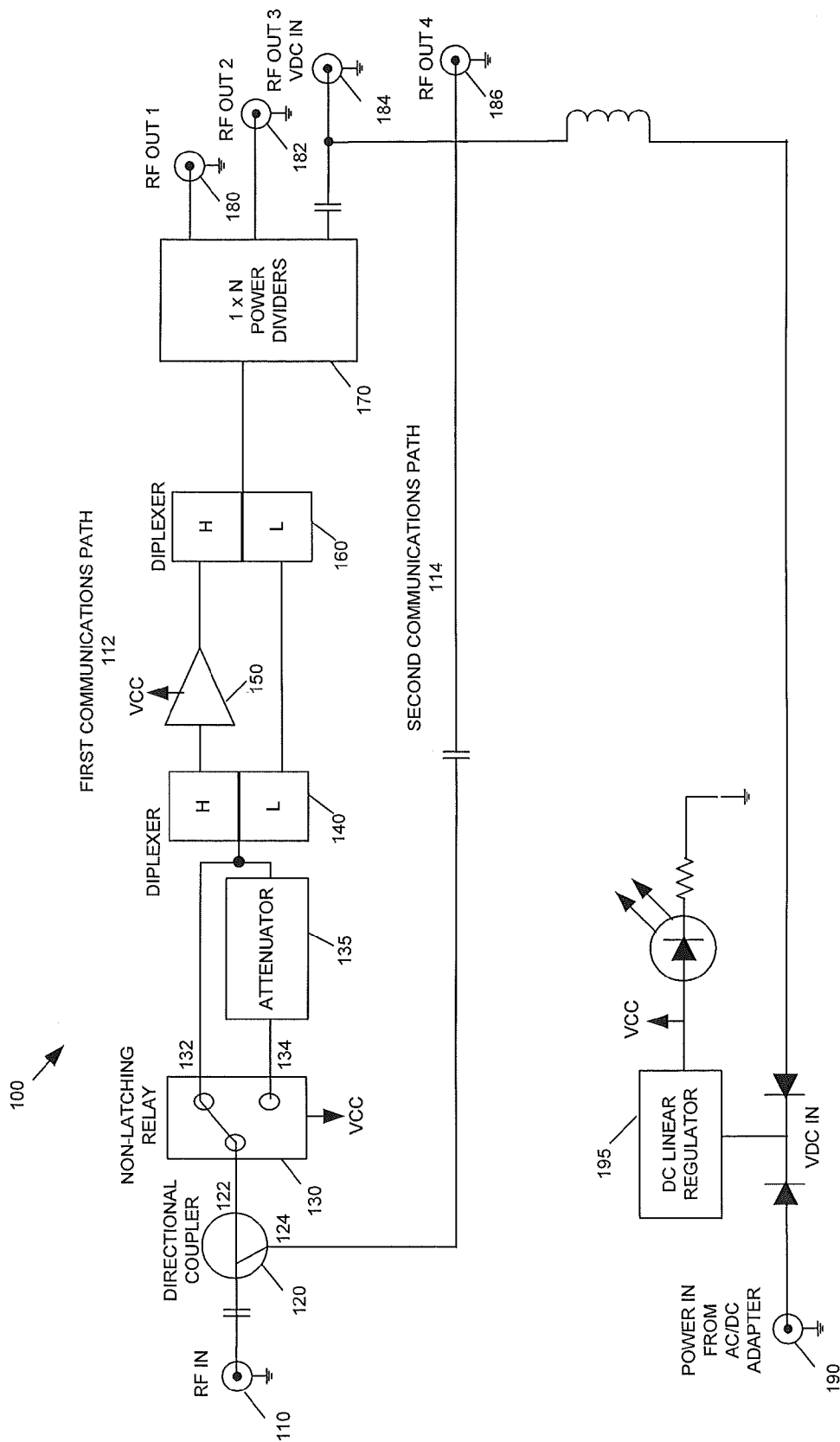
FIG. 1 is a block diagram of a bi-directional RF signal amplifier according to embodiments of the present invention.

FIG. 1 illustrates a block diagram of a bi-directional RF signal amplifier 100 according to certain embodiments of the present invention. RF signal amplifier 100 includes three RF output ports 180, 182, 184 that may be used to pass downstream and upstream signals between a service provider and multiple communications devices located in the subscriber premise when the RF signal amplifier is powered and operating normally. Moreover, RF signal amplifier 100 further includes a fourth non-interruptible RF output port 186 that may be used to maintain bi-directional RF communications even during power outages. Additionally, RF signal amplifier 100 may also maintain upstream (but not downstream) communications through RF output ports 180, 182, 184 during such power outages, which may be advantageous in some circumstances.

As shown in FIG. 1, RF signal amplifier 100 includes a bi-directional RF input port 110 for receiving downstream RF signals from a service provider, or any other appropriate signal source. RF input port 110 can also pass upstream signals in the reverse direction from the RF signal amplifier 100 to the service provider. Due to the bi-directional nature of communications through RF signal amplifiers according to embodiments of the present invention, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

As noted above, RF signal amplifier 100 further includes a plurality of bi-directional output ports 180, 182, 184, 186 that may be used to pass downstream RF signals from the RF signal amplifier 100 to one or more devices in communication with the output ports 180, 182, 184, 186, and to receive upstream RF signals from those devices so that they may be passed through the RF signal amplifier 100 to the service provider. It will be appreciated that any appropriate device that may advantageously send and/or receive an RF signal may be placed in communication with one or more of the various output ports 180, 182, 184, 186. For example, it is contemplated that telephone, CATV, Internet, VoIP, and/or data communication devices may be placed in such communication with a service provider where the RF signal amplifier 100 is installed in the residence of a subscriber. However, it will further be appreciated that any desired combination of these and/or other devices may be used where appropriate.

Signals received through RF input port 110 can be passed through RF signal amplifier 100 via a first communications path 112 that extends between RF input port 110 and RF output ports 180, 182, and/or 184. Specifically, the downstream signals that are received at RF input port 110 from the service provider are passed to a passive directional coupler 120 that has a first output port 122 that connects to the first communications path 112 and a second output port 124 that connects to the second communications path 114. The directional coupler 120 splits downstream RF signals onto the first communications path 112 and the second communications path 114. It will be appreciated that the directional coupler 120 may either evenly or unevenly split the power of the downstream signals between the first and second communications paths 112, 114, depending on the design of the overall circuit. The first communications path 112 may comprise an "active" communications path that amplifies at least one of downstream signals from the service provider to the subscriber premise or upstream signals from the subscriber premise to the service provider. The second communications path 114 may comprise a passive "non-interruptible" communications path that has no active components thereon, which allows downstream and/or upstream signals to traverse the second communications path 114 even if a power supply to the RF signal amplifier 100 is interrupted. In some embodiments, the second communications path 114 may provide a communications path for VoIP telephone service that will operate even during power outages at the subscriber premise (assuming that the modem and/or telephone, as necessary, are powered by a battery backup unit).

As is further shown in FIG. 1, downstream signals traversing the first communications path 112 pass from the first output 122 of directional coupler 120 to an input port of a switching device such as, for example, an SPDT non-latching relay 130. A first output 132 of the relay 130 is connected to an input of a high/low diplexer 140. A second output 134 of the relay 130 is connected to an attenuator 135. The design and operation of the attenuator 135 will be discussed in further detail herein.

The diplexer 140 separates the high frequency downstream signal from any low frequency upstream signals incident in the reverse direction. In various embodiments, diplexer 140 can filter the signals in a manner such that signals with frequencies greater than approximately 45-50 MHz are passed as high frequency downstream signals, while signals with frequencies lower than such range are passed in the reverse direction as low frequency upstream signals received from ports 180, 182, or 184. It will be appreciated, however, that other diplexer designs may be utilized.

The high frequency downstream signals filtered by diplexer 140 can be amplified by individual power amplifier 150, and passed through a second high/low diplexer 160 to a network of power dividers 170. The power dividers 170 may further split the downstream signal so that it may be distributed to each of RF output ports 180, 182, 184. While the power divider network 170 illustrated in FIG. 1 splits the downstream signals for distribution to three different RF output ports, it will be appreciated that the power divider network may split the downstream signals for distribution to different numbers of RF output ports (e.g., 4, 8, etc.), or may alternatively be omitted in situations where only a single RF output port is needed.

Turning now to the reverse (upstream) signal flow through the first communications path 112 of RF signal amplifier 100, upstream signals received by the RF signal amplifier 100 from devices in communication with ports 180, 182, and/or 184 are passed to power dividers 170 where they are combined into a composite upstream signal. This composite upstream signal is fed through high/low diplexer 160 for separating the low frequency composite upstream signal from any high frequency downstream signals incident in the forward direction. As previously discussed in relation to diplexer 140, the diplexer 160 can filter the signals such that signals with frequencies greater than approximately 45-50 MHz are passed in the forward direction as high frequency downstream signals, while signals with frequencies lower than such range are passed in the reverse direction as low frequency upstream signals received from ports 180, 182, and/or 184.

The composite low frequency upstream signal filtered by diplexer 160 can be passed directly to high/low diplexer 140, where it is then passed through the first output port 132 of the non-latching SPDT relay 130 to the first output port 122 of the directional coupler 120. The directional coupler 120 combines the upstream signal received at output port 122 with any upstream signal received at output port 124 and passes this combined signal to the RF input port 110 for output to a service provider or other entity in communication with RF input port 110.

The power amplifier 150 that is included on the first communications path 112 is an active device that must be powered via a power source such as a DC linear regulator that output a power supply voltage VCC. During normal operation, the RF signal amplifier 100 can be powered from a power input port 190 and/or power that is reverse fed through one of the RF output ports (e.g., output port 184, which is labeled RF OUT 3/VDC IN). In a typical installation at a subscriber premise, it is contemplated that RF signal amplifier 100 may be powered by an AC/DC adapter receiving power provided by the residence (for example, 100-230 VAC, 50/60 Hz). As illustrated in FIG. 1, the power received from either power input 190 or power input 184 may be provided to a voltage regulator 195 which supplies an operating voltage VCC to the power amplifier 150.

In the event that power to voltage regulator 195 is interrupted, voltage regulator 195 will be unable to provide operating voltage VCC to power amplifier 150. As a result, power amplifier 150 will not function to amplify the downstream signals received through RF input port 110 for distribution to the various output ports 180, 182, 184, and will typically appear as an undefined impedance circuit. Consequently, during power outages, the downstream portion of the first communications path 112 will be lost.

As noted above, RF signal amplifier 100 also has a second communications path 114 that extends from the second output 124 of the directional coupler 120 to the RF output port 186. This second communication path 114 bypasses the power amplifier 150 and does not include any active components; consequently, the second communications path 114 will remain available to pass communications between RF input port 110 and RF output port 186 even when the power supply to RF signal amplifier 100 is interrupted. Accordingly, the second communications path 114 is also referred to herein as a "non-interruptible" communications path. The second communications path 114 may be used to maintain essential services to the subscriber premises such as, for example, 911 emergency lifeline services, even during power outages, so long as the subscriber has a battery backup for the necessary devices connected to RF output port 186.

As is apparent from the above discussion, the directional coupler 120 is used to split a downstream signal received through RF input port 110 into two separate components, and delivers the first component of the split signal to RF output ports 180, 182 and 184 via the first communications path 112 and delivers the second component of the split signal to VoIP port 186 via the second communications path 114. The directional coupler 120 likewise combines any upstream signals that are received over the first and second communications paths 112, 114 and provides this combined upstream signal to the RF input port 110. Consequently, even if power is interrupted such that the power amplifier 150 is rendered inoperable, a second, bi-directional, non-interruptible communications path still exists between RF input port 110 and RF output port 186 which can be used to support at least one or more services, such as emergency 911 telephone service.

Unfortunately, when the power supply to RF signal amplifier 100 is interrupted, the power amplifier 150 may appear as an undefined impedance circuit along the first communications path 112. When this occurs, the functional impedance at the first output 122 of the directional coupler 120 may be difficult to predict, and will likely differ greatly from 75 ohms, which is the line impedance that coaxial cable networks are typically designed to exhibit. As a result, if the non-latching relay 130 remains set in its "through" position that is shown in FIG. 1 (which connects the input of relay 130 to output 132), the impedances of the two outputs 122, 124 of the directional coupler 120 will typically not be matched during power interruptions (since output 124 may have an impedance of approximately 75 ohms, whereas output 122 will typically have an impedance that differs significantly from 75 ohms due to the unknown impedance exhibited by the non-powered power amplifier 150). Such an impedance mismatch may give rise to signal reflections and other distortions that may significantly degrade any RF signals traversing the second communications path 114. These signal degradations may result in poor or even lost service on the second communications path 114.

The relay 130 is included in RF signal amplifier 100 to improve the impedance match between the outputs 122, 124 of the directional coupler 120 during power outages. In particular, as is shown in FIG. 1, the power supply voltage VCC is supplied to the relay 130. So long as the power supply voltage VCC is received at the relay 130, the relay 130 is maintained in its "through" position (i.e., the position illustrated in FIG. 1). In this position, downstream RF signals are passed from the input of the relay 130 to the first output 132 where they are fed directly to the first diplexer 140. However, when power (i.e., VCC) is interrupted, the relay 130 switches from the normal signal path in the "through" position, to the "attenuated" position such that the input to the relay 130 is connected to the second output 134. As noted above, the second output 134 of relay 130 (the "attenuated" port) is connected to an input to an attenuator 135. The output of the attenuator 135 is connected to the input of the first diplexer 140. When the power supply to RF signal amplifier 100 is interrupted, the relay 130 senses the interruption and automatically switches from the "through" position to the "attenuated" position, thereby placing the attenuator 135 in series between the relay 130 and the diplexer 140. The attenuator 135 may exhibit an impedance that is relatively close to 75 ohms, and hence the first output 122 of the directional coupler 120 will see an impedance of approximately 75 ohms. As such, signal degradation due to reflections and the like can be reduced or minimized in order to provide acceptable signal quality on the second, non-interruptible communications path 114 during power outages. Thus, it will be understood that the relay 130 may be used to route signals that are carried on the first communications path 112 over either a "through" branch of the first communications path that passes directly from the relay 130 to the diplexer 140, or instead may route the signals over an attenuated branch that passes from the relay 130, to the attenuator 135, and then to the diplexer 140. The relay 130 in the disclosed embodiment may automatically route the signals to the appropriate branch of the first communications path 112 based on whether or not a power supply signal VCC is received at the relay 130. It will also be appreciated that in other embodiments the relay 130 could be controlled manually and/or could be controlled based on other parameters (e.g., the relay could switch to the attenuated branch if a received power level is too high).

As should be clear from the above description, the RF signal amplifier 100 of FIG. 1 senses power interruptions and in response thereto automatically switches an attenuator 135 in series into the first communications path 112. This attenuator 135 may improve the impedance match at the directional coupler 120, and hence may improve the signal quality of signals carried over the second communications path 114 during such power interruptions.

Notably, when the attenuator 135 is switched into the first communications path 112 during power outages, a reverse upstream communications path is left in place between the RF output ports 180, 182, 184 and the RF input port that passes through the attenuator 135. In some embodiments, a relatively low value attenuator such as, for example, a 6 dB attenuator or an 8 dB attenuator may be used to implement the attenuator 135. Consequently, lower data rate upstream communications may be maintained between devices connected to RF output ports 180, 182, and/or 184 and the service provider, even during power outages.

For example, in some embodiments, downstream communications for certain services may be provided to a subscriber premise over a communications path that does not run through the RF signal amplifier 100 such as, for example, a separate fiber optic link, a satellite communications link or the like. For applications that, for example, have lower data rate upstream communications, these upstream communications may be provided through the RF signal amplifier 100. In some cases, it may be important to maintain these upstream communications for these applications, even during power outages. The RF signal amplifier 100 may provide this capability as upstream communications from RF output ports 180, 182 and/or 184 may be supported on the first communications path 112, even during power outages.

In other cases, there may be no need to maintain upstream communications from RF output ports 180, 182 and/or 184 during power outages. Under these circumstances, attenuators that provide a greater degree of attenuation (e.g., a 20 dB attenuator) may be used to implement the attenuator 135. These higher value attenuators may more closely match the impedance seen at the first output 122 of the directional coupler 120 to 75 ohms during power outages.

In some embodiments, the attenuator 135 may be a "plug-in" attenuator that a technician may install in the field. Consequently, if a particular subscriber requires upstream communications from one or more of RF output ports 180, 182, 184 during power outages, a relatively low value attenuator (e.g., a 6 dB or 8 dB attenuator) may be inserted into an attenuator port within the RF signal amplifier 100 by the technician. If, instead, upstream communications are not required from RF output ports 180, 182, 184 during power outages, a higher value attenuator (e.g., a 20 dB attenuator) may be inserted into the attenuator port within the RF signal amplifier 100 by the technician.

Figure 2:
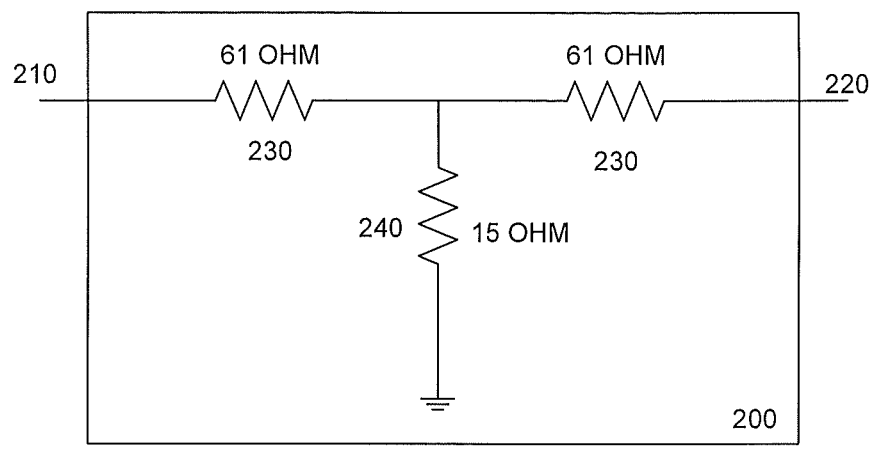
FIG. 2 is a circuit diagram of an attenuator according to certain embodiments of the present invention that may be used to implement the attenuator of FIG. 1.

FIG. 2 is a circuit diagram of a 20 dB attenuator 200 according to certain embodiments of the present invention that may be used to implement the attenuator 135 of the RF signal amplifier 100 of FIG. 1. As shown in FIG. 2, the attenuator 200 comprises a pair of 61 ohm resistors 230 that are connected in series between an input 210 and an output 220 of attenuator 200, and a shunt 15 ohm resistor 240 that extends between a node that is between the two 61 ohm resistors 230 and a reference voltage (which in this case is a ground voltage). The attenuator 200 will attenuate RF signals in the frequency range of interest (e.g., frequencies from 5 MHz to 1 GHz) by at least 20 dB.

Figure 3:
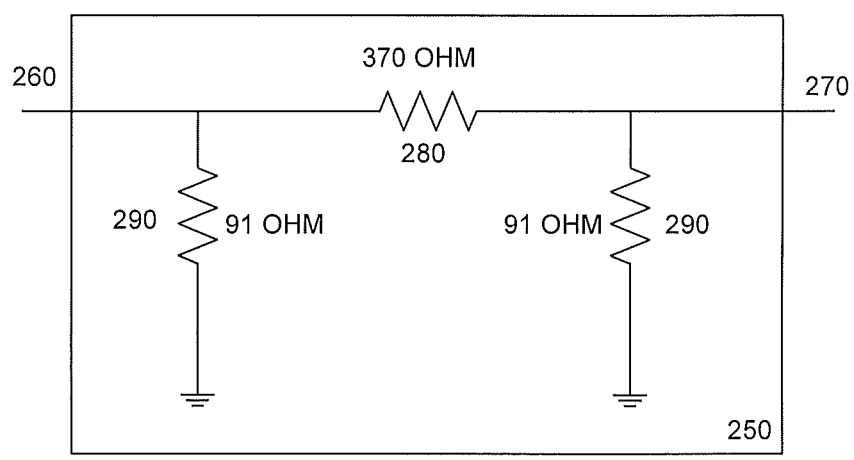
FIG. 3 is a circuit diagram of an attenuator according to further embodiments of the present invention that may be used to implement the attenuator of FIG. 1.

FIG. 3 is a circuit diagram of a 20 dB attenuator 250 according to further embodiments of the present invention that may be used to implement the attenuator 135 of the RF signal amplifier 100 of FIG. 1. As shown in FIG. 3, the attenuator 250 comprises a 370 ohm resistor 280 that is connected in series between an input 260 and an output 270 of attenuator 250, and a pair of shunt 91 ohm resistors 290 that extend between each side of the resistor 280 and a reference voltage (which in this case is a ground voltage). The attenuator 250 will likewise attenuate RF signals in the frequency range of interest (e.g., frequencies from 5 MHz to 1 GHz) by at least 20 dB. While attenuators 200 and 250 are disclosed to provide concrete examples of suitable attenuator designs, it will be appreciated that any appropriate attenuator design may be used and that the attenuator may be rated for a wide range of values.

Figure 4:
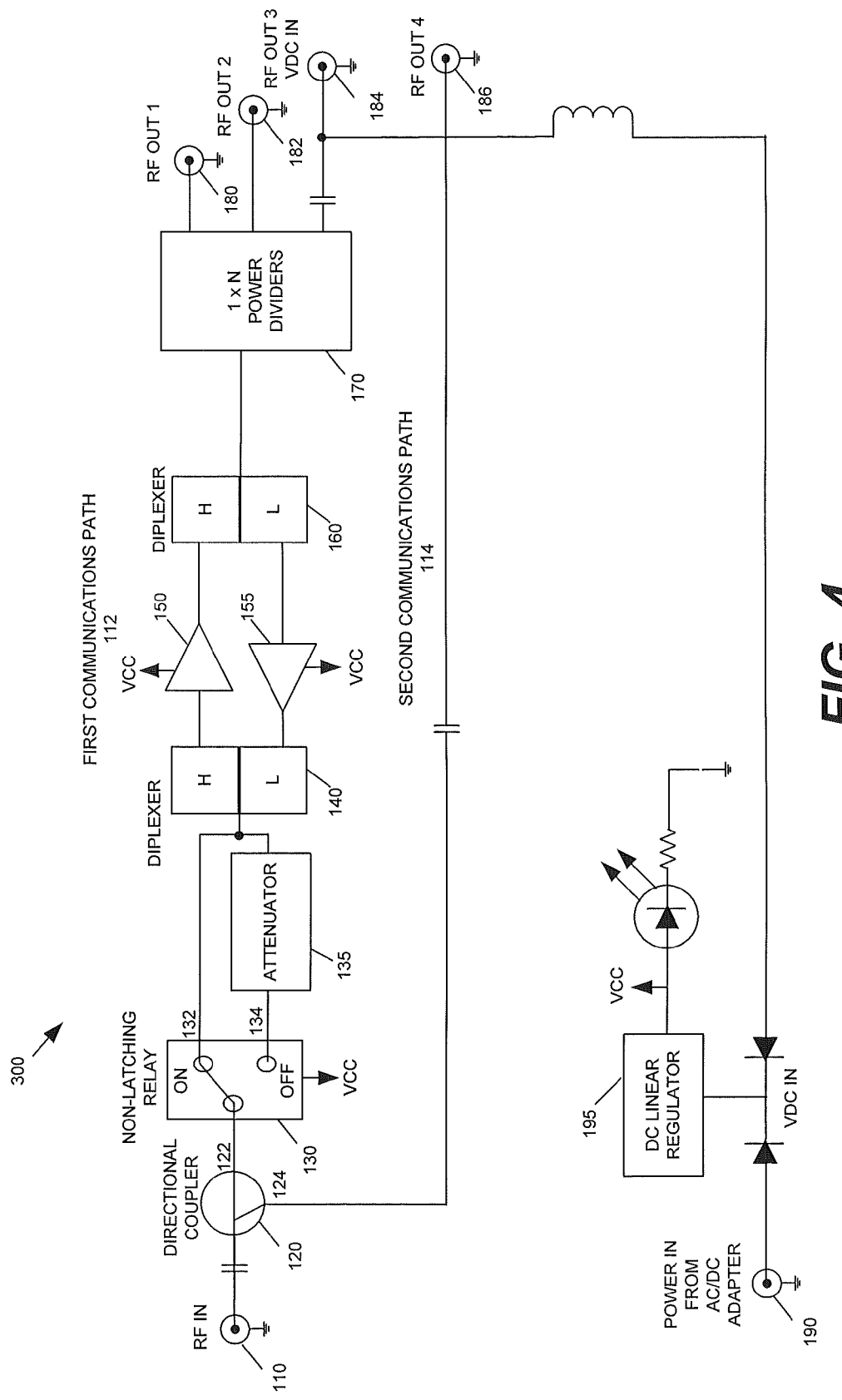
FIG. 4 is a block diagram of a bi-directional RF signal amplifier according to further embodiments of the present invention.

FIG. 4 is a block diagram of a bi-directional RF signal amplifier 300 according to further embodiments of the present invention. The bi-directional RF signal amplifier 300 is identical to the RF signal amplifier 100 that is described above with respect to FIG. 1, except that RF signal amplifier 300 includes a second power amplifier 155 that is disposed on the upstream portion of the first communications path 112 between the second diplexer 160 and the first diplexer 140. The second power amplifier 155 may be used to amplify the upstream signals received over RF output ports 180, 182 184. It will be appreciated that the RF signal amplifier 300 will not provide an upstream communications path between the RF output ports 180, 182, and 184 during power outages, as the VCC power feed to power amplifier 155 will be lost during such power outages, and consequently amplifier 155 will appear as an undefined impedance circuit during power outages. However, by providing an amplified upstream on the first communications path 112 improved performance may be provided when the RF signal amplifier 300 is properly powered. As aside from the above-mentioned differences RF signal amplifier 300 includes the same components and operates in essentially the exact same manner as RF signal amplifier 100, further discussion of RF signal amplifier 300 will be omitted.

Figure 5:
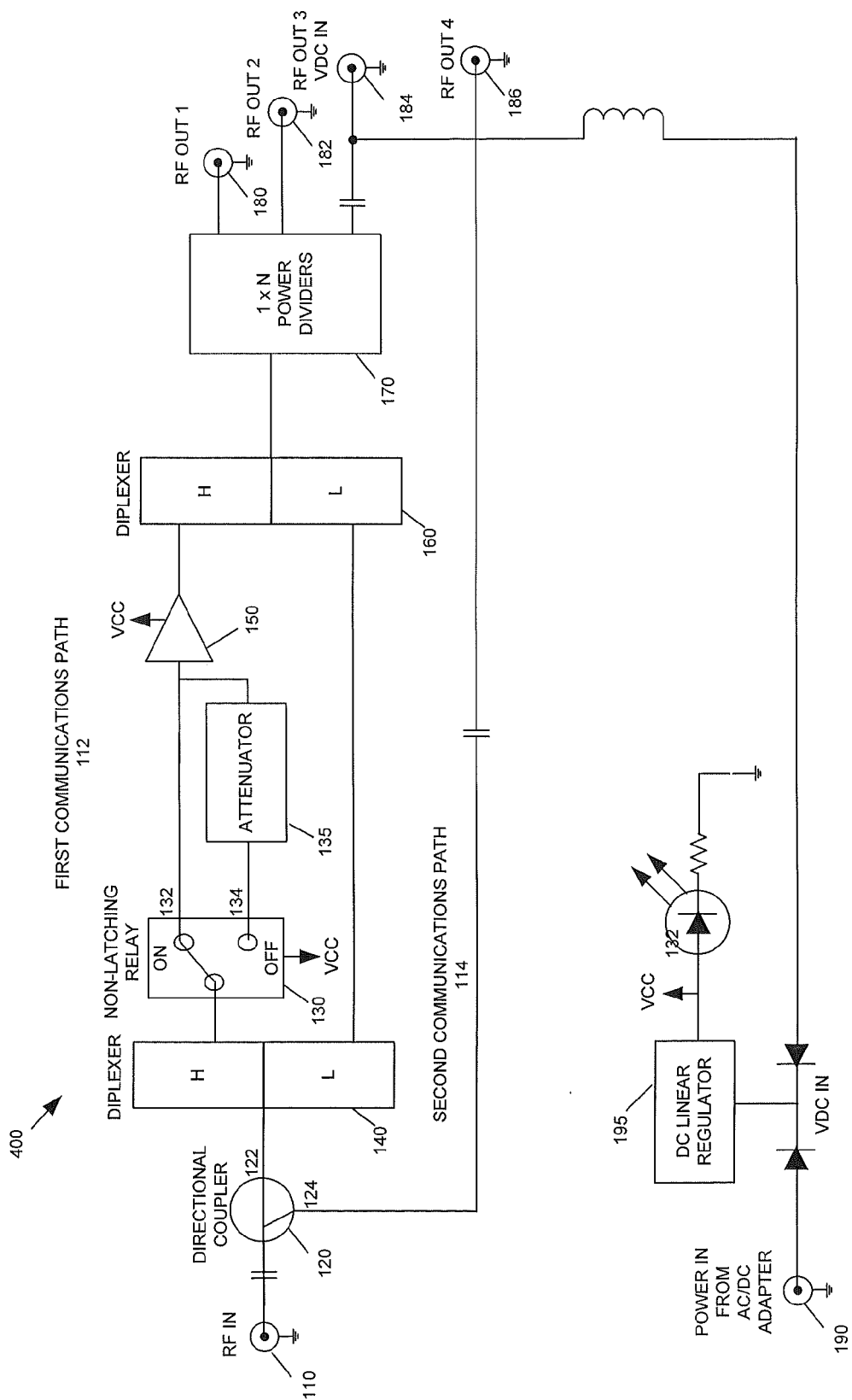
FIG. 5 is a block diagram of a bi-directional RF signal amplifier according to still further embodiments of the present invention.

FIG. 5 is a block diagram of a bi-directional RF signal amplifier 400 according to further embodiments of the present invention. The bi-directional RF signal amplifier 400 is identical to the RF signal amplifier 100 that is described above with respect to FIG. 1, except that in RF signal amplifier 400 the non-latching relay 130 and the attenuator 135 are moved downstream of the first diplexer 140. As RF signal amplifier 400 includes the same components and operates in essentially the exact same manner as RF signal amplifier 100, further discussion of RF signal amplifier 400 will be omitted.

Figure 6:
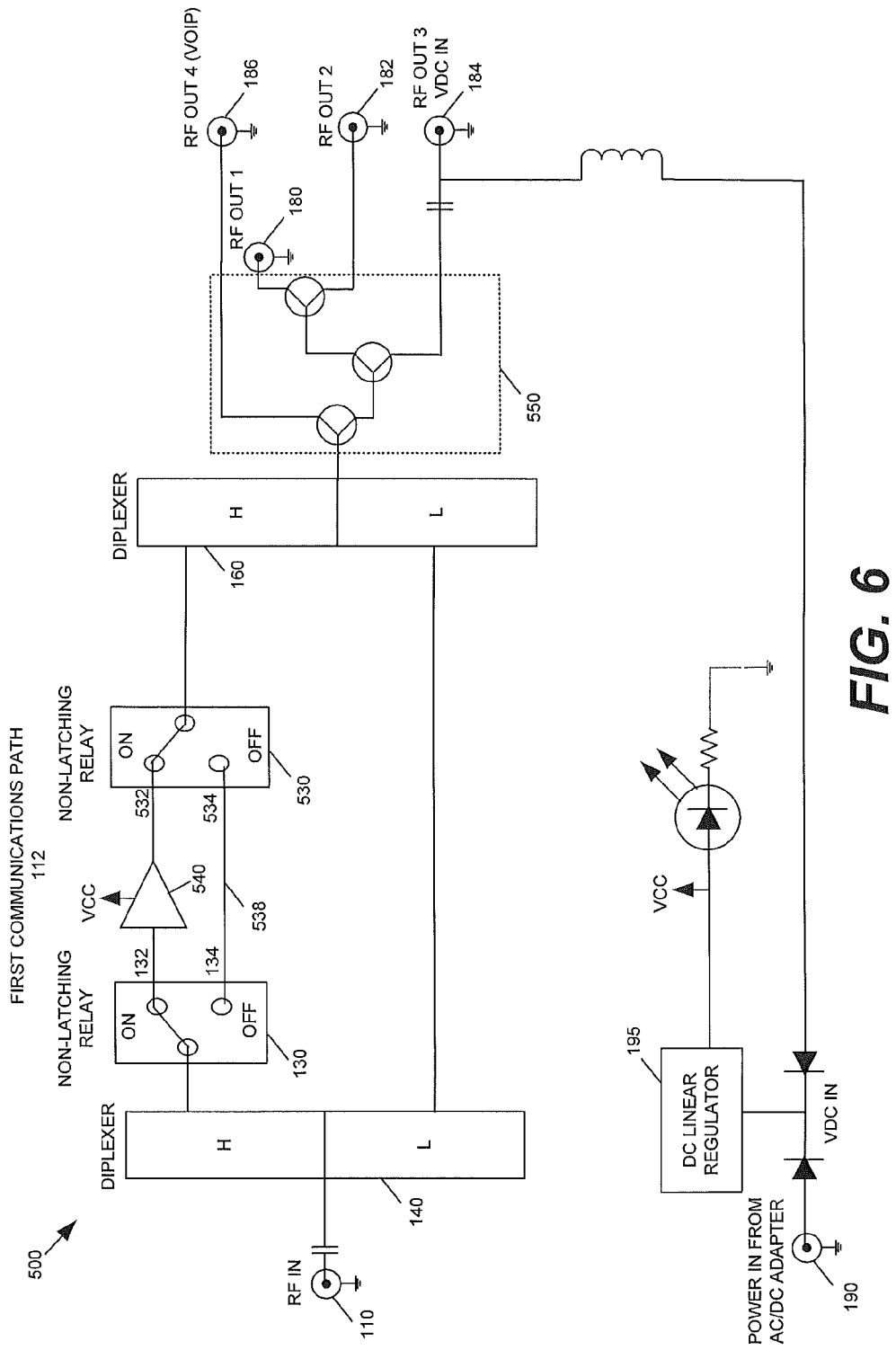
FIG. 6 is a block diagram of a bi-directional RF signal amplifier according to yet additional embodiments of the present invention.

FIG. 6 is a block diagram of a bi-directional RF signal amplifier 500 according to still further embodiments of the present invention. The bi-directional RF signal amplifier 500 is similar to the RF signal amplifier 400 that is described above with respect to FIG. 5. However, as shown in FIG. 6, the RF signal amplifier 500 only includes the first communications path 112, and hence both the directional coupler 120 and the second communications path 114 are omitted from the RF signal amplifier 500. In order to provide for communications during power outages, the RF signal amplifier further includes a second non-latching relay 530 that has outputs 532 and 534. The non-latching relay 530 is positioned in the first communications path 112 between the power amplifier 150 and the second diplexer 160.

When power is supplied to RF signal amplifier 500, each of the non-latching relays 130, 530 will stay in a first position (referred to herein as the "ON" position) such that the input of relay 130 connects to port 132 and the input of relay 530 connects to port 532. Consequently, downstream RF signals that are received at RF input port 110 will pass through the high side of diplexer 140, through relay 130, through power amplifier 150, through relay 530, through the high side of diplexer 160 to the power divider network for distribution to RF output ports 180, 182, 184. When the power supply to RF signal amplifier 500 is interrupted, relays 130 and 530 sense this interruption (since the power supply voltage VCC is no longer received at relays 130, 530) and automatically reset from their "ON" positions to a second position which is referred to herein as the "OFF" position. When this occurs the relays 130, 530 isolate the power amplifier from the downstream portion of the first communications path 112, and switch a passive path 538 that connects output 134 of relay 130 to output 534 of relay 530. The upstream portion of the first communications path 112 is a passive path so that it is generally not impacted by the loss of power to RF signal amplifier 500.

One potential advantage of the RF signal amplifier 500 is that it can provide a bi-directional communications path to all of the RF output ports 180, 182, 184 that will remain in place even when the power supply to RF signal amplifier 500 is interrupted (although the ability to amplify the downstream signals will be lost when the power supply is lost). However, the design of RF signal amplifier 500 includes a second non-latching relay which can increase the manufacturing costs of the amplifier.

Figure 7:
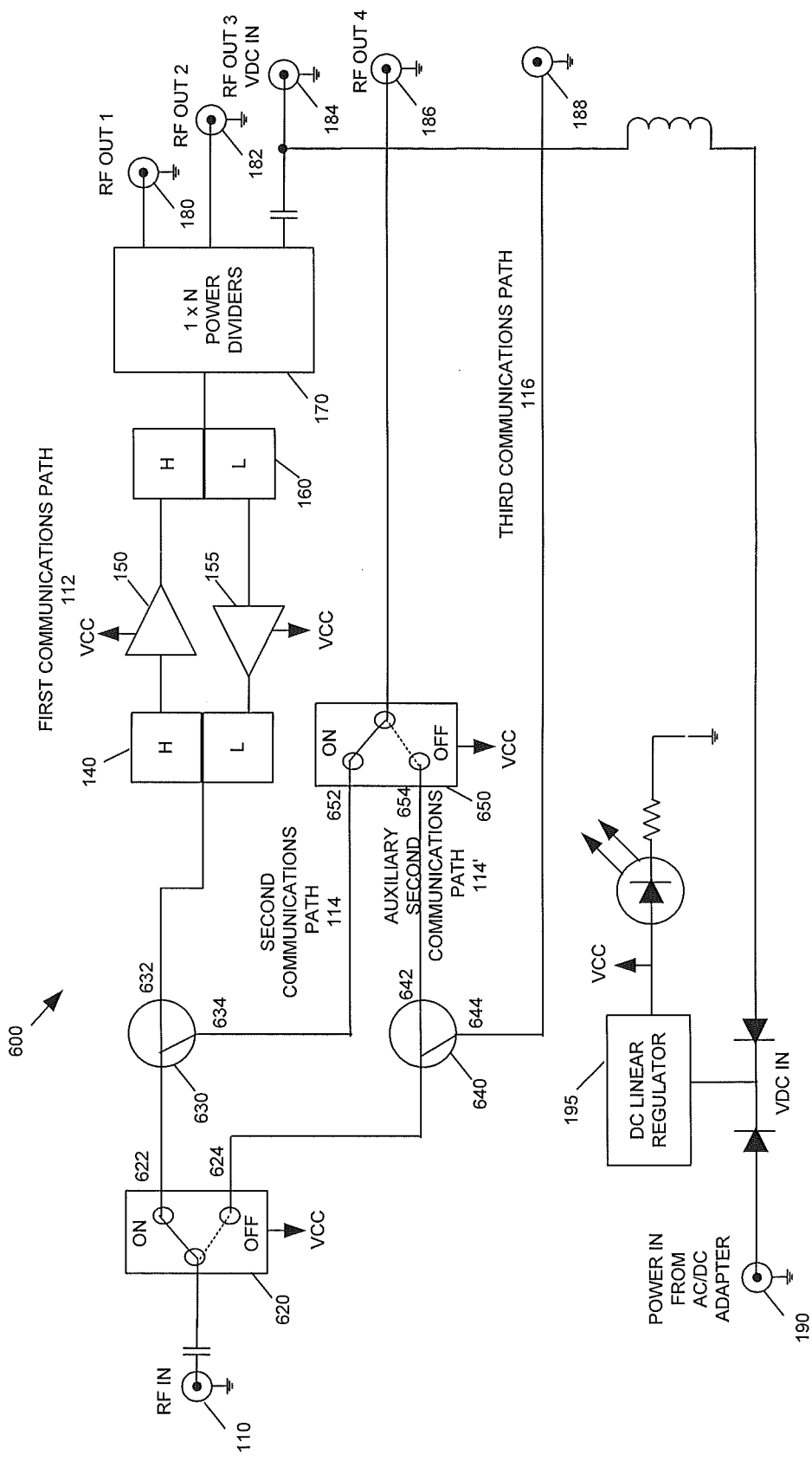
FIG. 7 is a block diagram of a bi-directional RF signal amplifier according to even further embodiments of the present invention.

FIG. 7 is a block diagram of a bi-directional RF signal amplifier 600 according to still further embodiments of the present invention. The bi-directional RF signal amplifier 600 includes an RF input port 110, first and second non-latching relays 620, 650, first and second directional couplers 630, 640, first and second high-low diplexers 140, 160, first and second power amplifiers 150, 155, a power divider network 170, and RF output ports 180, 182, 184, 186, 188. The RF input port 110, the first and second high-low diplexers 140, 160, the first and second power amplifiers 150, 155, the power divider network 170, and RF output ports 180, 182, 184 have been described previously and hence further discussion of these components will be omitted.

As shown in FIG. 7, the input to the first relay 620 is coupled to the RF input port 110. A first output 622 of relay 620 is coupled to the input of the first directional coupler 630, and a second output 624 of relay 620 is coupled to the input of the second directional coupler 640. A first output 632 of the first directional coupler 630 is coupled to the input to the first diplexer 140, and a second output 634 of the first directional coupler 630 is coupled to a first output 652 of the second relay 650. A first output 642 of the second directional coupler 640 is coupled to the second output 654 of the second relay 650, and a second output 644 of the second directional coupler 640 is coupled to RF output port 188. Finally, the input to the second relay 650 is coupled to RF output port 186.

When power is supplied to RF signal amplifier 600, relays 620, 650 will remain in their "ON" positions, as shown by the solid line signal path within each relay 620, 650 in FIG. 7. Under these conditions, a first communications path 112 is provided between RF input port 110 and each of RF output ports 180, 182, 184, which includes amplification on both the downstream and upstream components of the communications path. Additionally, a second communications path 114 is provided between RF input port 110 and RF output port 186 via the relays 620, 650 and the first directional coupler 630. This second communications path 114 is a passive, non-amplified communications path.

When the power supply to RF signal amplifier 600 is interrupted, relays 620, 650 will reset to their "OFF" positions, as schematically shown in FIG. 7 by the dotted lines within each relay 620, 650. Under these conditions, the first communications path 112 becomes inoperable, as the power amplifiers 150, 155 cease to operate and will no longer pass signals. While the second communications path 114 also is lost due to the resetting of relays 620 and 650, an auxiliary second communications path 114' is simultaneously created between RF input port 110 and RF output port 186 that passes through the first relay 620, the second directional coupler 640, and the second relay 650. Additionally, during times when the power supply is interrupted, a third communications path 116 is established between RF input port 110 and RF output port 188. This third communications path 116 passes through the first relay 620 and the second directional coupler 640. The third communications path 116 may be used, for example to provide a communications path for a second device at the subscriber premise such as, for example, a cable modem that provides Internet connectivity for a laptop computer. To operate properly during power outages, this cable modem would need a battery backup to power the cable modem during the power outage.

Figure 8:
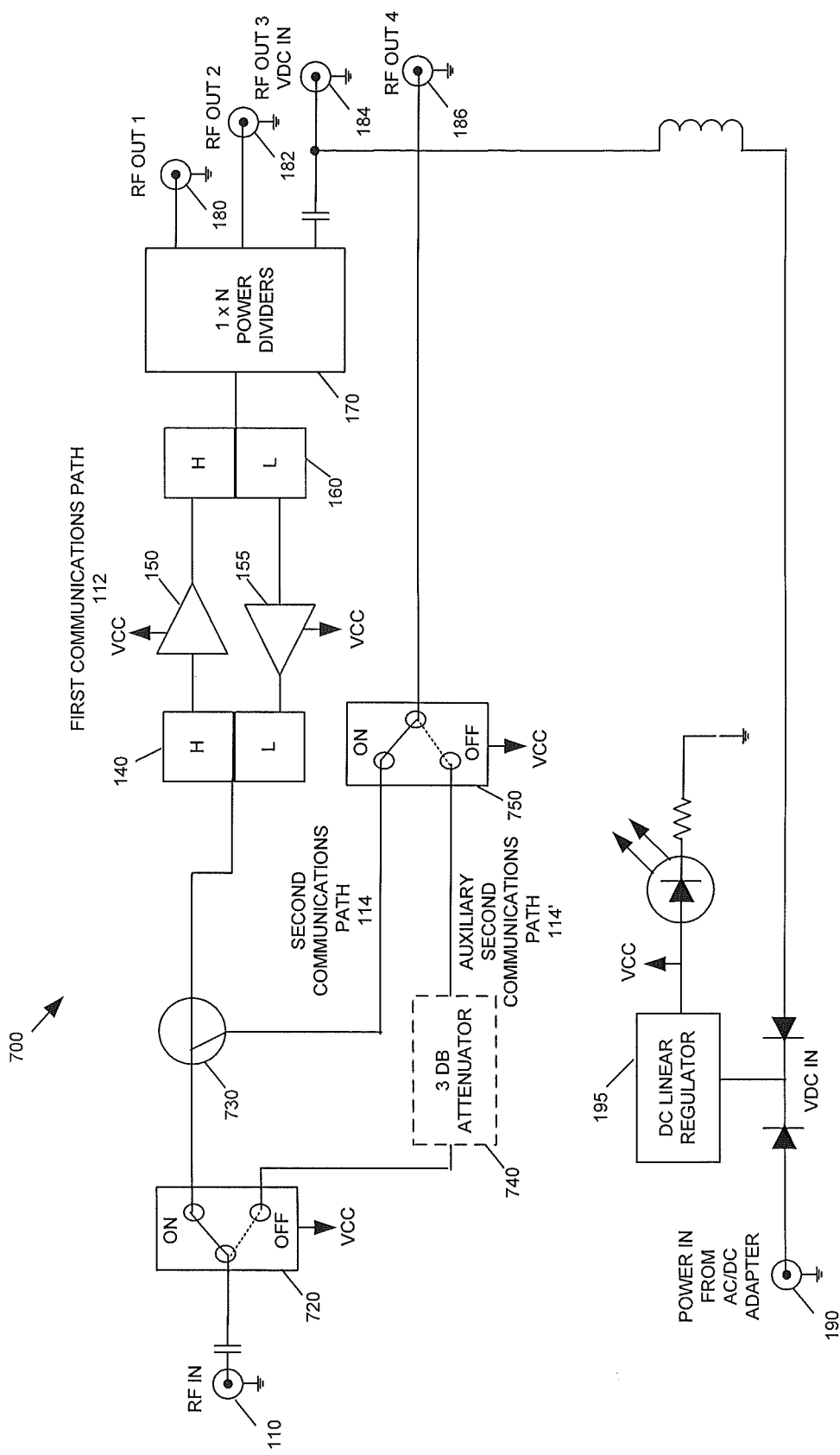
FIG. 8 is a block diagram of a bi-directional RF signal amplifier according to still further embodiments of the present invention.

FIG. 8 is a block diagram of a bi-directional RF signal amplifier 700 according to still further embodiments of the present invention. The bi-directional RF signal amplifier 700 is similar to the RF signal amplifier 600 of FIG. 7, except that in the RF signal amplifier 700 of FIG. 8, the RF output port 188 is omitted and the directional coupler 640 of amplifier 600 is either omitted or replaced with a 3 dB attenuator 740.

The first communications path 112 of RF amplifier 700 will operate in the exact same manner as the first communications path 112 of RF amplifier 600, and accordingly further description of this communications path of RF amplifier 700 will be omitted. RF signal amplifier 700 further includes a second communications path 114 and an auxiliary second communications path 114' that are similar to the second communications path 114 and auxiliary second communications path 114' of RF signal amplifier 600. The second communications path 114 and auxiliary second communications path 114' of RF signal amplifier 700 operate as follows. When power is supplied to RF signal amplifier 700, relays 620, 650 will remain in their "ON" positions, thereby providing a second communications path 114 between RF input port 110 and RF output port 186 that passes through the first relay 620, the directional coupler 630 and the second relay 650. When the power supply to RF signal amplifier 700 is interrupted, relays 620, 650 will reset to their "OFF" positions, which will disable the second communications path 114. However, the resetting of relays 620 and 650 establish the auxiliary second communications path between RF input port 110 and RF output port 186 that passes through the first relay 620, the 3 dB attenuator 740 (if provided) and the second relay 650. Thus, the combination of the second communications path 114 and the auxiliary second communications path 114' together provide a non-interruptible communications path between RF input port 110 and RF output port 186. Note that the RF signal amplifier 700 does not include the third communications path 116 or the RF output port 188 that are included in the RF signal amplifier 600 of FIG. 7. The 3 dB attenuator 740, which is optional, may be provided so that the attenuation of the second communications path 114 and the auxiliary second communications path 114' may be similar.

As noted above, it may be desirable in some applications to include the 3 dB attenuator 740 so that signals traversing the second communications path 114 will experience approximately the same amount of attenuation in situations where power is supplied to the RF signal amplifier 700 and in situations in which power is not supplied to the RF signal amplifier 700. However, in other applications, it may be desirable to omit the attenuator 740 as this may provide improved performance during power outages. In particular, as discussed above, when a power feed is provided to the RF signal amplifier 700, signals traverse the second communications path 114, which runs through the "ON" positions of relays 720 and 750 and through the directional coupler 730. As is known to those of skill in the art, the insertion loss of SPDT relays may be on the order of 0.5 dB, while the insertion loss of a conventional directional coupler that evenly splits a received signal is on the order of 3.5 dB to 4 dB. Thus, when power is supplied to the RF signal amplifier 700, the insertion loss on the second communications path 114 may be on the order of 4.5 dB to 5 dB.

In contrast, when the power feed to the RF signal amplifier is lost, signals instead traverse the auxiliary second communications path 114', which runs through the "OFF" positions of relays 720 and 750, and thus does not pass through the directional coupler 730. As such, the insertion loss on the auxiliary second communications path 114' may be on the order of 1 dB, and should certainly be less than 1.5 dB. During power outages, any devices in the subscriber premise that are communicating through the RF signal amplifier 700 will be doing so on battery power. These devices may automatically adjust their signal transmission levels based on the level of attenuation experienced. Thus, by omitting the attenuator 740, it may be possible to reduce the attenuation that signals traversing the auxiliary second communications path 114' will experience during power outages by 3.5 dB to 4.0 dB (i.e., by more than a factor of two). This reduction in transmit power level may reduce the power consumption of the device communicating through the RF signal amplifier 700. As the battery operated devices will only have limited charge, this reduction in power consumption may extend the battery life, thereby allowing for communications for longer periods during power interruptions. Thus, RF signal amplifiers according to some embodiments of the present invention may provide ultra low losses during power interruptions, which may extend the period of time during the power interruption during which a communications capability is provided.

Figure 9:
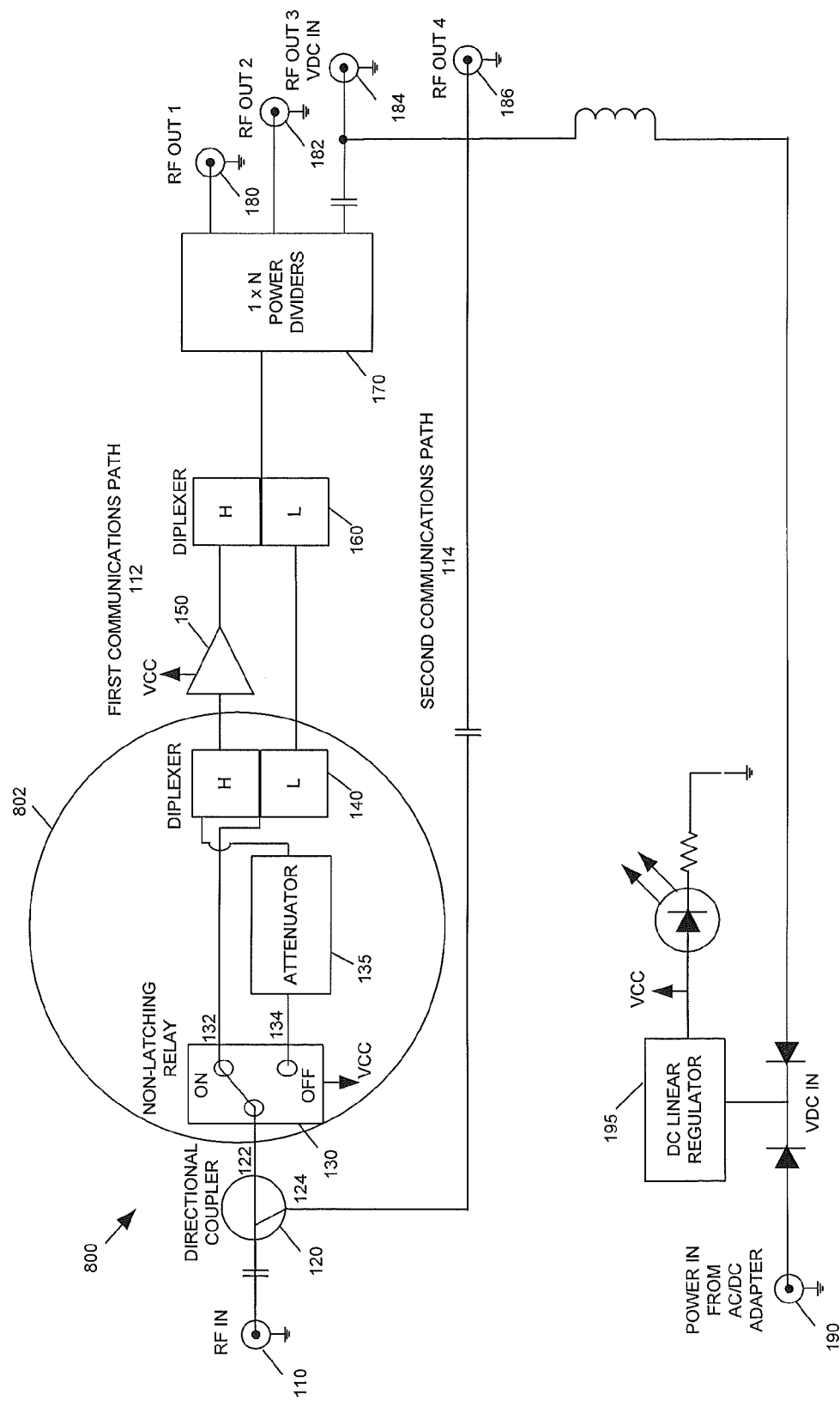
FIG. 9 is a block diagram of a bi-directional RF signal amplifier according to still further embodiments of the present invention.
Figure 10:
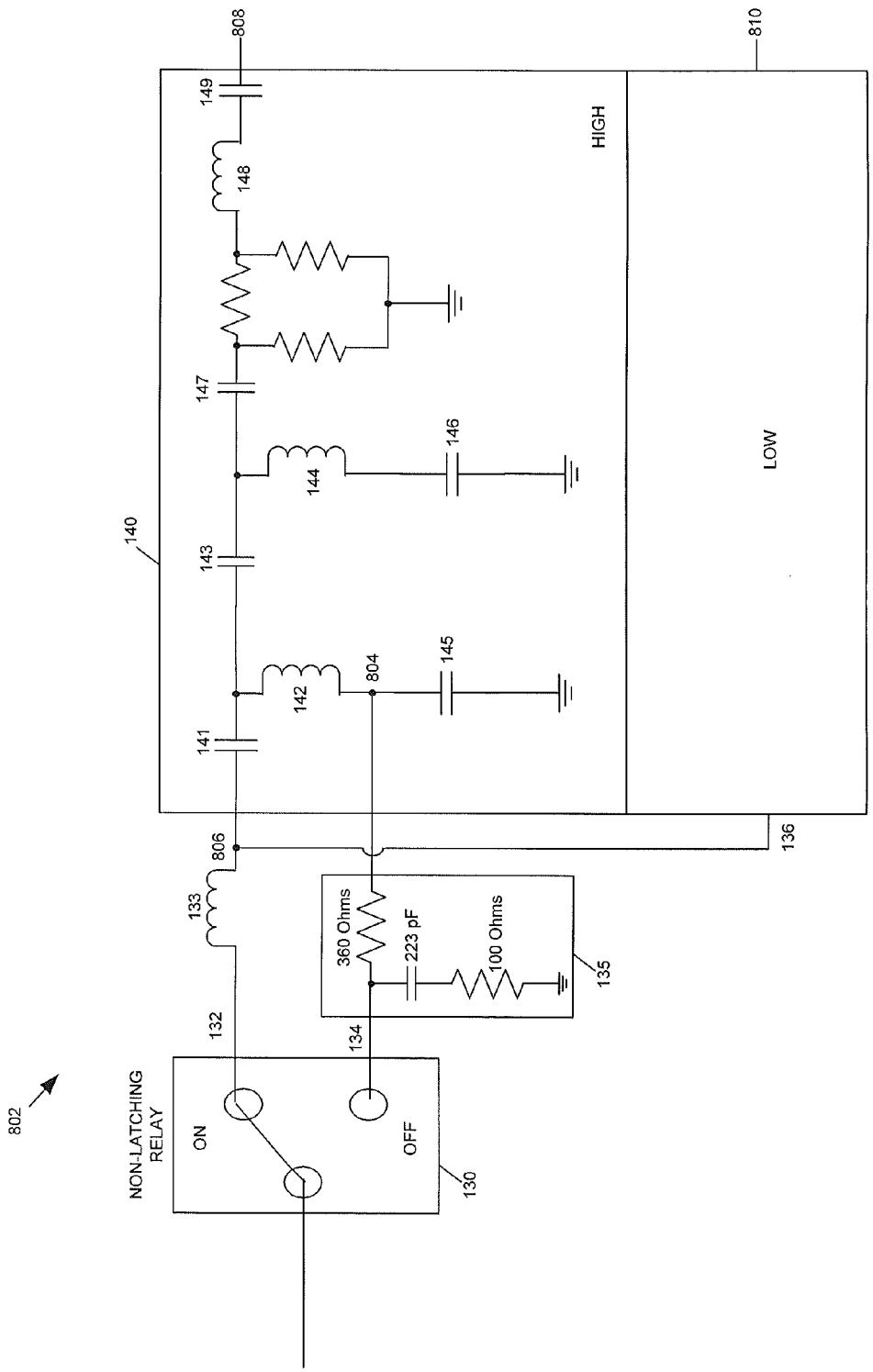
FIG. 10 is a circuit diagram of a portion of the bi-directional RF signal amplifier of FIG. 9.

FIG. 9 is a block diagram of a bi-directional RF signal amplifier 800 according to still further embodiments of the present invention. FIG. 10 is a circuit diagram of the portion of FIG. 9 enclosed in the call-out 802. As shown in FIG. 9, the bi-directional RF signal amplifier 800 is similar to the RF signal amplifier 100 of FIG. 1, except that in the RF signal amplifier 800 of FIGS. 9 and 10, the output of the attenuator 135 connects into the middle of the circuitry used to implement diplexer 140. As discussed below, this configuration may provide improved insertion loss performance.

As shown in FIG. 10, the diplexer 140 includes a common port 806, a high frequency port 808 and a low frequency port 810. The common port 806 is connected to the first output 132 of relay 130 through an inductor 133. The common port 806 connects the output 132 of relay 130 to both the high frequency side of the diplexer 140 (i.e., to capacitor 141) and to the low frequency side of the diplexer (i.e., to node 136). As is well understood to those of skill in the art, the high frequency side of the diplexer 140 includes a high pass filter or a band pass filter that allows higher frequency signals to pass between the common port 806 and the high frequency port 808 (e.g., signals in the 54-1002 MHz frequency range) while substantially attenuating lower frequency signals (e.g., signals in the 5-42 MHz frequency range). Similarly, the low frequency side of the diplexer 140 includes a low pass filter (or a band pass filter) that allows lower frequency signals to pass between the common port 806 and the low frequency port 810 (e.g., signals in the 5-42 MHz frequency range) while substantially attenuating higher frequency signals (e.g., signals above 54 MHz). It should be noted that in FIG. 10 a portion of the circuit elements of the high frequency side of the diplexer 140 are shown while none of the circuit elements on the low frequency side of the diplexer 140 are shown in order to simplify the drawing.

As is further shown in FIG. 10, the attenuator 135 may be implemented using a 223 pF capacitor and a 100 ohm resistor that are connected to ground and a 360 ohm resistor. It will be appreciated, however, that a wide variety of different attenuator designs may be used. Moreover, in contrast to the embodiment of FIG. 1, the output of the attenuator 135 is directly connected to a node within the circuitry of the band pass or high pass filter provided on the high frequency side of the diplexer 140. This can be seen in the circuit diagram of FIG. 10, which shows various of the circuit elements included in the high side of the diplexer 140. As shown in FIG. 10, the output of the attenuator 135 connects to a node 804 that is located between an inductor 142 and a capacitor 145. The inductor 142 and the capacitor 145 form a pole of the filter circuit provided on the high frequency side of the diplexer 140. Under normal operating conditions when power is supplied to the non-latching relay 130, the inductor 142 "shields" the attenuator 135 from the forward and reverse communications paths, as will be explained in more detail below.

In particular, referring back to the embodiment of FIG. 1 that is discussed above, it can be seen that when power is being supplied to the non-latching relay 130, the output of the attenuator 135 is directly connected to the forward and reverse communications paths. As such, the attenuator 135 acts to attenuate signals on both the forward and reverse paths by providing a path to ground for a portion of the signal energy. While the attenuation of the forward path signals may be compensated for by increasing the gain on the power amplifier 150, the reverse path may not be an amplified path, and hence the attenuation from attenuator 135 may reduce the margin on reverse path signals. If this attenuation is too high, it may lower the power level and/or signal-to-noise ratio of the reverse path signals below acceptable levels (which may depend on the requirements of the communications system that the RF signal amplifier 100 is used in).

One potential advantage of the embodiment of FIGS. 9 and 10 is that when power is supplied to the non-latching relay 130, the inductor 142 acts to partially shield the reverse path signal from the attenuator 135, and hence may reduce the amount of insertion loss experienced by reverse path signals. This can reduce any negative impact that the attenuator 135 may have on reverse path signals during normal operation. Moreover, when the power supply to the non-latching relay 130 is lost, an electrical path is still provided for reverse path signals from the low side of the diplexer 140 (i.e., node 136) to the input of the non-latching relay 130. In particular, as shown in FIG. 10, this path extends from node 136, to the capacitor 141, to the inductor 142, to the attenuator 135, to the output 134 of the relay 130. While the inductor 142 may increase the loss on the reverse path when the non-latching relay 130 is in its OFF state, simulations indicate that a viable reverse path is still provided that can support reverse communications during power outages. Moreover, the inductor 142 may also reduce the impact of the attenuator 135 on forward path signals when the non-latching relay 130 is in its ON state as the inductor 142 also shields the forward path from the attenuator 135. Thus, by connecting the output of the attenuator 135 into the middle of filter circuitry of the high frequency side of the diplexer 140, improved insertion loss performance may be obtained for both forward and reverse path signals when the non-latching relay 130 is in its ON state.

Figure 11:
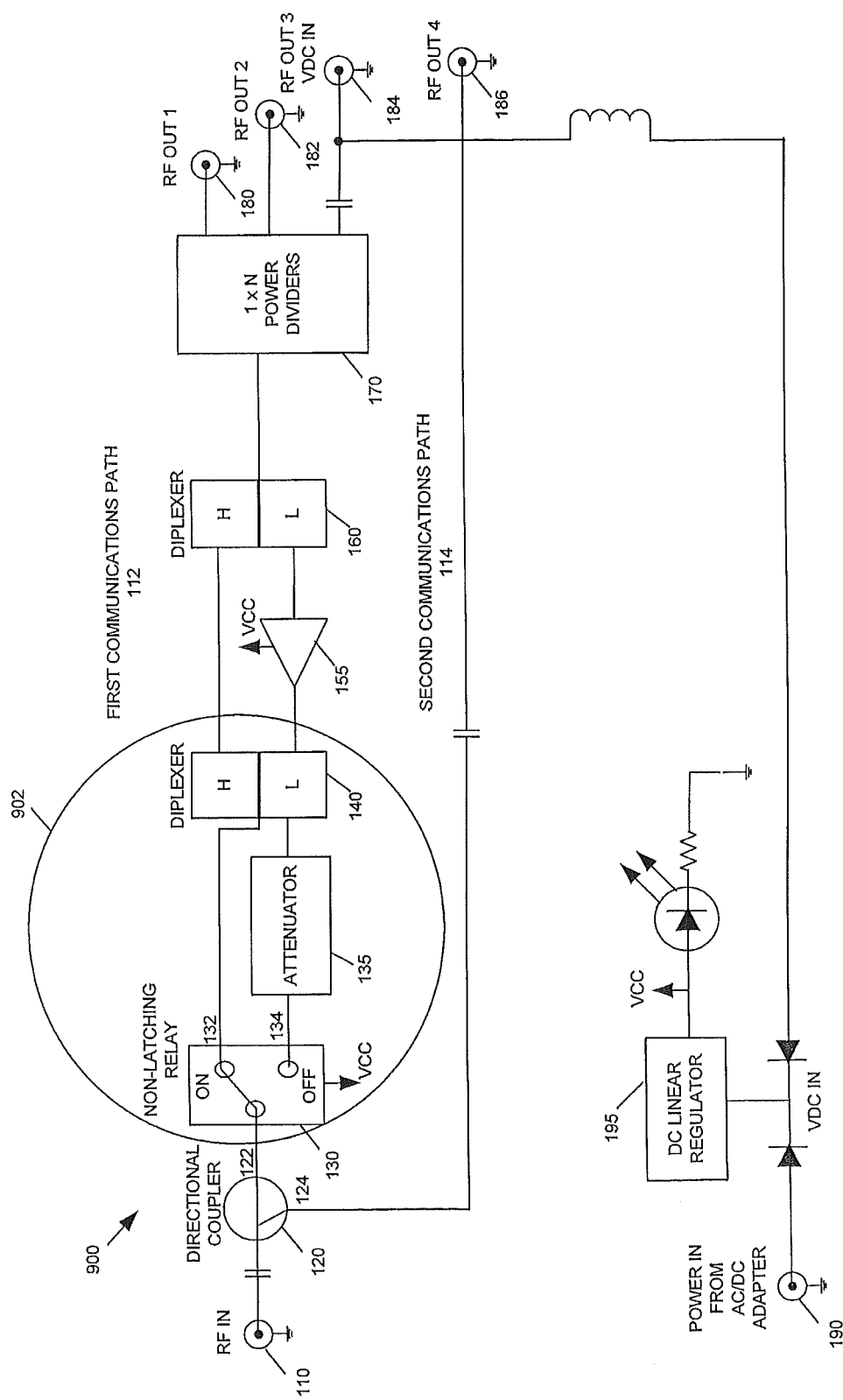
FIG. 11 is a block diagram of a bi-directional RF signal amplifier according to yet further embodiments of the present invention.
Figure 12:
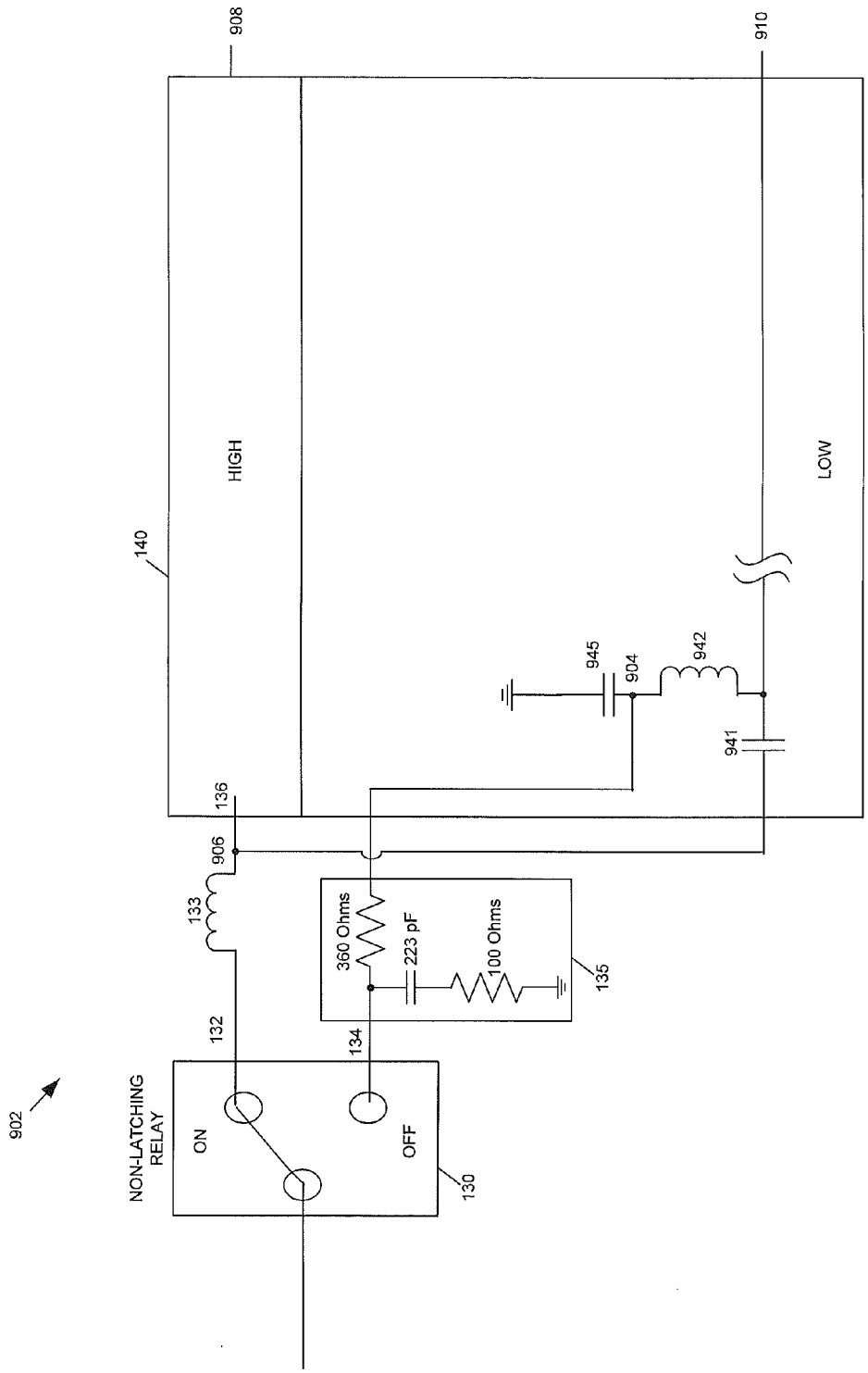
FIG. 12 is a circuit diagram of a portion of the bi-directional RF signal amplifier of FIG. 11.

FIG. 11 is a block diagram of a reverse direction RF signal amplifier 900 according to still further embodiments of the present invention. FIG. 12 is a circuit diagram of the portion of FIG. 11 enclosed in the call-out 902. As shown in FIG. 11, the RF signal amplifier 900 is similar to the RF signal amplifier 800 of FIGS. 9-10, except that in the RF signal amplifier 900 of FIGS. 11 and 12, the forward path power amplifier 150 is omitted and the output of the attenuator 135 connects into the circuitry on the low side of the diplexer 140 as opposed to connecting into the circuitry on the high side of the diplexer 140. This configuration may provide the above-discussed benefits for reverse gain VoIP signal amplifiers.

As shown in FIG. 11, the diplexer 140 includes a common port 906, a high frequency port 908 and a low frequency port 910. The common port 906 is connected to the first output 132 of relay 130 through an inductor 133. The common port 906 connects the output 132 of relay 130 to both the low frequency side of the diplexer 140 (i.e., to capacitor 141) and to the high frequency side of the diplexer (i.e., to node 136). As is well understood to those of skill in the art, the high frequency side of the diplexer 140 includes a high pass filter or a band pass filter (not shown) that allows higher frequency signals to pass between the common port 906 and the high frequency port 908 (e.g., signals in the 54-1002 MHz frequency range) while substantially attenuating lower frequency signals (e.g., signals in the 5-42 MHz frequency range). Similarly, the low frequency side of the diplexer 140 includes a low pass filter (or a band pass filter) that allows lower frequency signals to pass between the common port 906 and the low frequency port 910 (e.g., signals in the 5-42 MHz frequency range) while substantially attenuating higher frequency signals (e.g., signals above 54 MHz). It should be noted that in FIG. 12 a portion of the circuit elements of the low frequency side of the diplexer 140 are shown while none of the circuit elements on the high frequency side of the diplexer 140 are shown in order to simplify the drawing.

As is further shown in FIG. 12, the attenuator 135 may be implemented using a 223 pF capacitor and a 100 ohm resistor that are connected to ground and a 360 ohm resistor. It will be appreciated, however, that a wide variety of different attenuator designs may be used. Moreover, in contrast to the embodiment of FIG. 1, the output of the attenuator 135 is directly connected to a node within the circuitry of the low pass filter provided on the low frequency side of the diplexer 140. This can be seen in the circuit diagram of FIG. 12, which shows some of the circuit elements included in the low side of the diplexer 140. As shown in FIG. 12, the output of the attenuator 135 connects to a node 904 that is located between an inductor 942 and a capacitor 945. The inductor 942 and the capacitor 945 form a pole of the filter circuit provided on the low frequency side of the diplexer 140. Under normal operating conditions when power is supplied to the non-latching relay 130, the inductor 942 "shields" the attenuator 135 from the forward and reverse communications paths, in the same manner that the inductor 142 does in the embodiment of FIGS. 9 and 10, as is discussed above.

Figure 13:
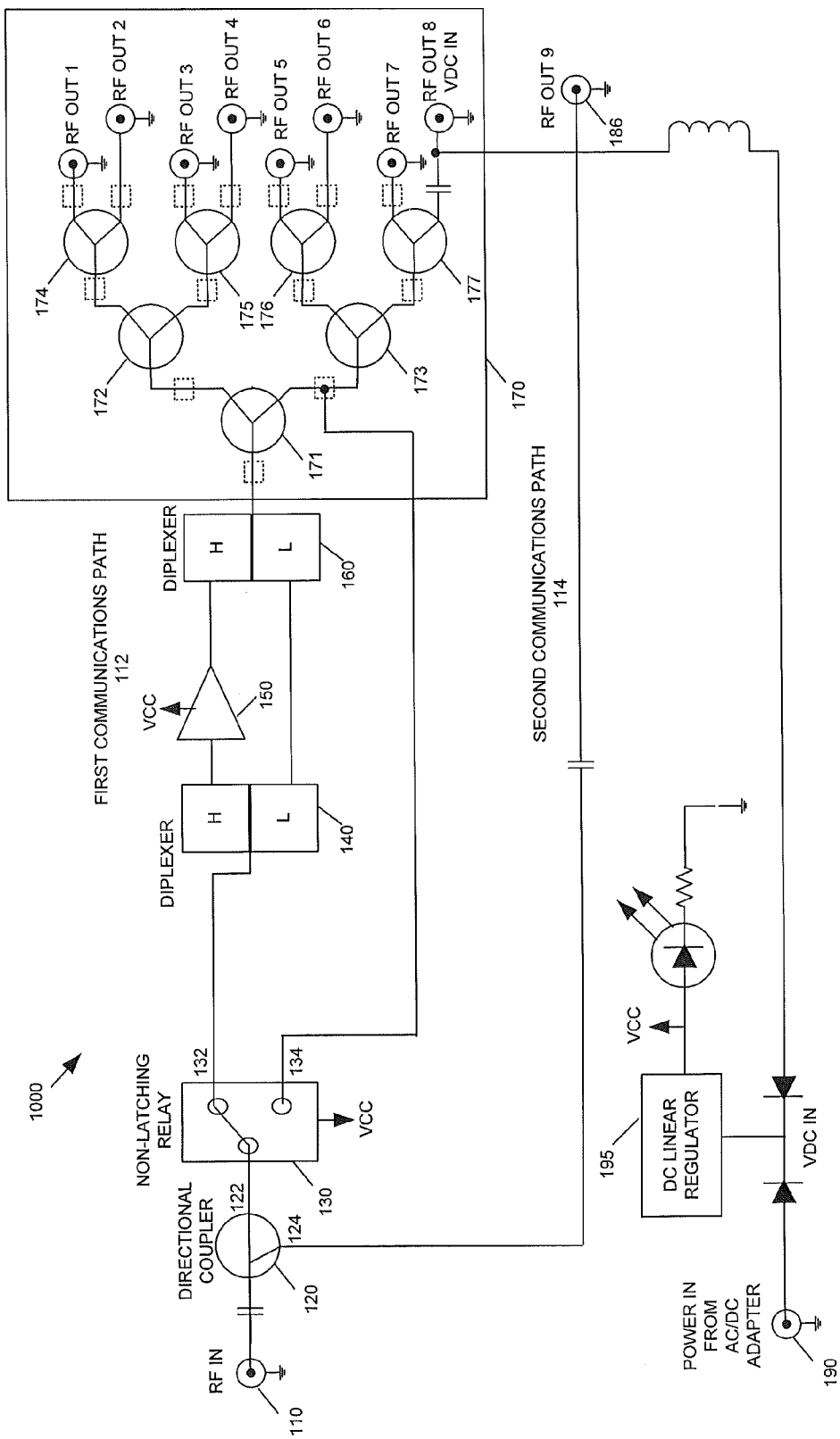
FIG. 13 is a circuit diagram of a bi-directional RF signal amplifier according to yet additional embodiments of the present invention.

FIG. 13 is a block diagram of a bi-directional RF signal amplifier 1000 according to still further embodiments of the present invention. As shown in FIG. 13, the bi-directional RF signal amplifier 1000 is similar to the RF signal amplifier 100 of FIG. 1, except that in the RF signal amplifier 1000 of FIG. 13, the attenuator 135 is removed, and the second output 134 of the non-latching relay 130 is connected within the power divider network 170. As shown in FIG. 13, the power divider network 170 may be implemented using a plurality of directional couplers 171-177. The second output 134 of the non-latching relay 130 is connected at either an input or an output of one of the individual power dividers 171-177. In the particular example shown in FIG. 13, the second output 134 of the non-latching relay 130 is connected to the electrical connection between directional coupler 171 and directional coupler 173. However, it will be appreciated that the connection could be made at any of the other boxes shown in dotted lines within the power divider network 170. As the directional couplers 171-177 are designed to have a nominal impedance of 75 ohms, the second output 134 of the non-latching relay 130 will be connected to a matched termination.

It will be appreciated that the term "directional couplers" is used herein to encompass both directional couplers that evenly or unevenly divide an RF signal received at an input thereof.

The foregoing disclosure is not intended to limit the present invention to the precise forms or particular fields of use disclosed. It is contemplated that various alternate embodiments and/or modifications to the present invention, whether explicitly described or implied herein, are possible in light of the disclosure.

That which is claimed is:

1. A bi-directional RF signal amplifier, comprising
   an RF input port;
   a switching device having an input that is coupled to the RF input port, a first output and a second output;
   a diplexer having a common port, a high frequency port and a low frequency port, wherein the first output of the switching device is coupled to the common port; and
   an attenuator that has an attenuator input that is coupled to the second output of the switching device and an attenuator output that is directly connected to a node within the internal circuitry of the diplexer.

2. The bi-directional RF signal amplifier of claim 1, wherein the node is between two circuit elements of a filter that is coupled between the common port and the high frequency port of the diplexer.

3. The bi-directional RF signal amplifier of claim 1, wherein the two circuit elements of the filter comprise two circuit elements that form a first pole of the filter.

4. The bi-directional RF signal amplifier of claim 1, further comprising:
   a power input for receiving electrical power;
   wherein the switching device is configured to pass signals between the input of the switching device and the first output of the switching device when electrical power is received at the power input and that is further configured to pass signals between the input of the switching device and the second output of the switching device when an electrical power feed to the power input is interrupted.

5. The bi-directional RF signal amplifier of claim 4, wherein the diplexer comprises a first diplexer, the bi-directional RF signal amplifier further comprising:
   a power amplifier having an input that is coupled to the high frequency port of the first diplexer; and
   a second diplexer that is coupled between an output of the power amplifier and the first RF output port.

6. The bi-directional RF signal amplifier of claim 5, further comprising a power regulation circuit that receives electrical power from the power input and that outputs a power supply voltage, wherein the power supply voltage is coupled to the power amplifier and the switching device.

7. The bi-directional RF signal amplifier of claim 1, wherein the attenuator includes at least one resistor coupled in series on a signal path extending between the attenuator input and the attenuator output and at least one resistor shunted between the signal path and a reference voltage.

8. An RF signal amplifier, comprising:
   a switching device having an input, a first output and a second output;
   a diplexer having a common port, a high frequency port and a low frequency port; and
   an attenuator that has an attenuator input that is coupled to the second output of the switching device and an attenuator output,
   wherein the common port of the diplexer is coupled to the first output of the switching device, and
   wherein at least one inductive element of the diplexer is disposed between the output of the attenuator and the first output of the switching device.

9. The RF signal amplifier of claim 8, wherein the inductive element comprises an inductor that is part of a filter circuit included between the common port and the high frequency port of the diplexer.

10. The RF signal amplifier of claim 9, wherein the attenuator comprises a first resistor coupled in series along a signal path between the attenuator input and the attenuator output and at least one resistor shunted between the signal path and a reference voltage.

11. The RF signal amplifier of claim 10, wherein the switching device comprises a non-latching relay.

12. An RF signal amplifier, comprising:
   a switching device having an input, a first output and a second output;
   a diplexer having a common port, a high frequency port and a low frequency port; and
   an attenuator that has an attenuator input that is coupled to the second output of the switching device and an attenuator output,
   wherein the common port of the diplexer is coupled to the first output of the switching device, and
   wherein at least one capacitive element is disposed between the output of the attenuator and the first output of the switching device.

13. The RF signal amplifier of claim 12, wherein the capacitive element comprises a capacitor that is part of a filter circuit included between the common port and the low frequency port of the diplexer.

14. The RF signal amplifier of claim 13, wherein the attenuator comprises a first resistor coupled in series along a signal path between the attenuator input and the attenuator output and at least one resistor shunted between the signal path and a reference voltage.

15. The RF signal amplifier of claim 14; wherein the switching device comprises a non-latching relay.

* * * * *

UNITED STATES PATENT AND TRADEMARK OFFICE
CERTIFICATE OF CORRECTION

PATENT NO.         : 8,971,792 B2  
APPLICATION NO.    : 13/761369  
DATED              : March 3, 2015  
INVENTOR(S)        : Riggsby et al.

Page 1 of 1

It is certified that error appears in the above-identified patent and that said Letters Patent is hereby corrected as shown below:

In the Claims:

Column 16, Claim 3, Line 59: Please correct "of claim 1,"
to read -- of Claim 2, --

Column 17, Claim 5, Line 12: Please correct "the first RF output port."
to read -- a first RF output port. --

Signed and Sealed this
Eighteenth Day of August, 2015

Michelle K. Lee
*Director of the United States Patent and Trademark Office*